(12) United States Patent
Avci

(10) Patent No.: US 12,727,133 B2
(45) Date of Patent: Sep. 1, 2026

(54) ISOLATOR ARCHITECTURE FOR ELECTRICAL ISOLATORS

(71) Applicant: Elevation Microsystems, Inc., Wilmington, DE (US)

(72) Inventor: Celal Avci, Istanbul (TR)

(73) Assignee: Elevation Microsystems, Inc., Wilmington, DE (US)

( * ) Notice: Subject to any disclaimer, the term of this patent is extended or adjusted under 35 U.S.C. 154(b) by 68 days.

(21) Appl. No.: 19/056,216

(22) Filed: Feb. 18, 2025

(65) Prior Publication Data

US 2025/0267831 A1 Aug. 21, 2025

Related U.S. Application Data

(60) Provisional application No. 63/555,124, filed on Feb. 19, 2024, provisional application No. 63/555,118, filed on Feb. 19, 2024.

(51) Int. Cl.
*H05K 9/00* (2006.01)

(52) U.S. Cl.
CPC .................................. *H05K 9/0073* (2013.01)

(58) Field of Classification Search
CPC .................................................. H05K 9/0073
See application file for complete search history.

(56) References Cited

U.S. PATENT DOCUMENTS

| | | | | |
|---|---|---|---|---|
| 9,257,834 | B1 * | 2/2016 | Moghe | H02H 7/205 |
| 12,087,986 | B2 * | 9/2024 | Lum | H01P 1/2007 |
| 2014/0262464 | A1 * | 9/2014 | Chen | H04B 5/22<br>174/261 |
| 2024/0291696 | A1 * | 8/2024 | Shrivastava | H03K 5/19 |

* cited by examiner

*Primary Examiner* — Hung V Ngo

(57) ABSTRACT

In one embodiment, an electrical isolator includes a first electrical component and a second electrical component configured to wirelessly communicate electrical signals with each other. The electrical isolator includes an isolation barrier that has one or more dielectric layers that electrically isolate the first electrical component from the second electrical component. The electrical isolator further includes one or more dielectric layers between a substrate on which the isolator is mounted and the isolation barrier, where the one or more dielectric layers between the substrate and the isolation barrier include (1) one or more thin dielectric layers; and (2) one or more thick dielectric layers that reduce a parasitic electrical coupling between the substrate and at least one of the first electrical component and the second electrical component.

12 Claims, 2 Drawing Sheets

ISOLATOR ARCHITECTURE FOR ELECTRICAL ISOLATORS

PRIORITY CLAIM

This application claims the benefit under 35 U.S.C. § 119 of (1) U.S. Provisional Patent Application No. 63/555,118 filed Feb. 19, 2024 and (2) U.S. Provisional Patent Application No. 63/555,124 filed Feb. 19, 2024, which are incorporated by reference herein.

TECHNICAL FIELD

This application generally relates to electrical isolators.

BACKGROUND

Electrical isolators create electrical separation between two or more components of an electrical system. However, electrical isolators can pass signals or power through the isolated components, for example by using capacitive or inductive methods. For instance, electrical isolators may be used to safely transmit data between electrical components that operate at different voltage domains.

Inductive isolators use a changing magnetic field between two coils to transmit signals across an isolation barrier. Inductive isolators can use transformers to vary the magnetic field, where the strength of the magnetic field depends on the coil structure of the primary and secondary windings, the permittivity of the magnetic core, and the current magnitude.

Capacitive isolators use a changing electric field to transmit signals across an isolation barrier. A capacitive isolator is typically formed by using two capacitor plates with a dielectric material between the plates. The isolation barrier rating is determined by the capacitor plate size, distance between the plates, and the dielectric material. Capacitive isolators may have a higher efficiency, in both size and energy transfer, compared to inductive isolators. Capacitive isolators also have higher immunity to magnetic fields, thereby providing superior performance in the presence of external magnetic fields.

DESCRIPTION OF EXAMPLE EMBODIMENTS

Figure 1:
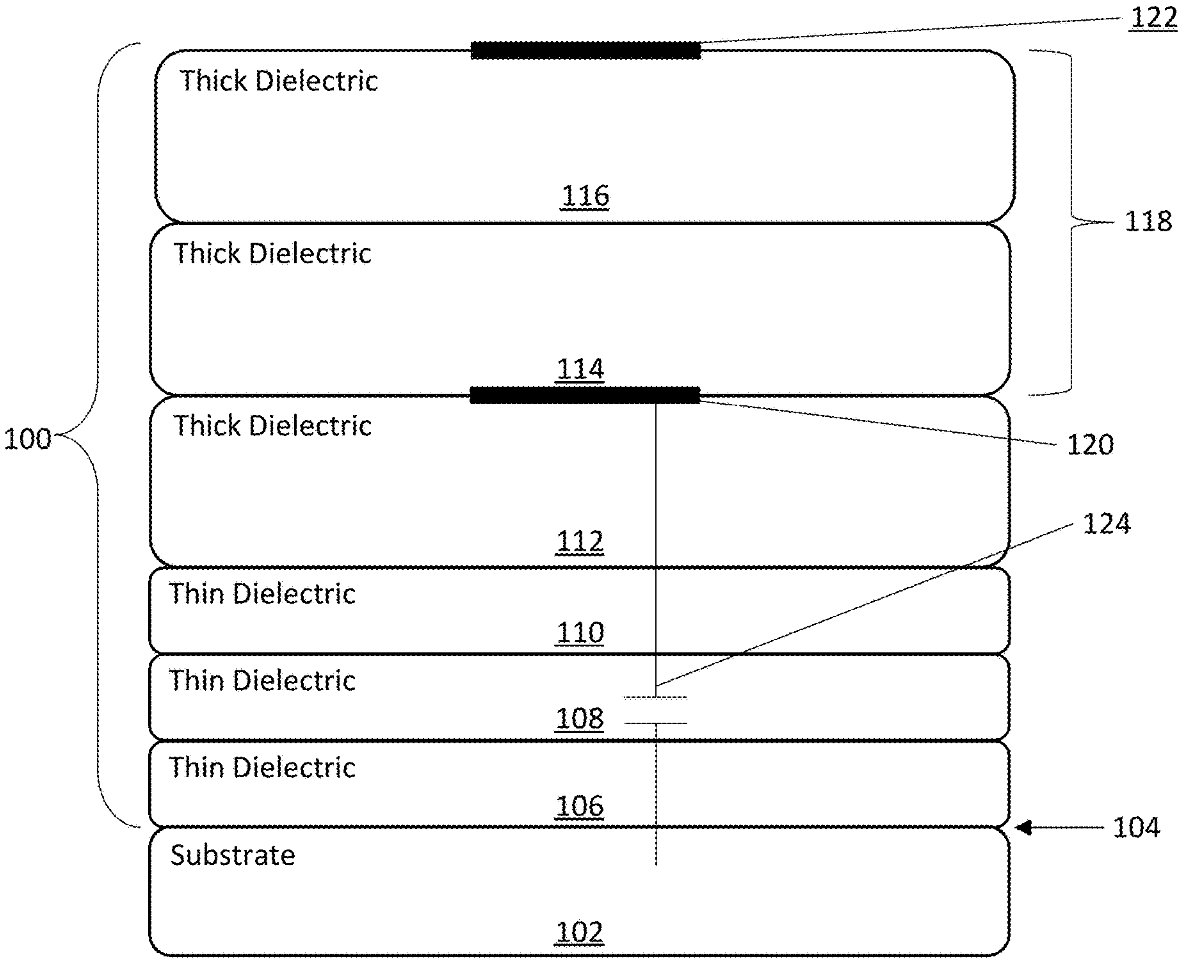
FIG. 1 illustrates an example isolator structure.

FIG. 1 illustrates an example isolator structure of embodiments described herein. Isolator 100 is mounted on a substrate 102, i.e., substrate 102 provides mechanical support for the isolator.

Isolator 100 includes components 120 and 122 for wirelessly transmitting signals between those components, i.e., without current directly flowing between components 120 and 122. In particular embodiments, components 120 and 122 may form a capacitive structure, for example where component 120 and component 122 are each metal plates. In particular embodiments, components 120 and 122 may form an inductive structure, for example where components 120 and 122 are each inductive coils.

Components 120 and 122 are separated by an isolation barrier 118. Isolation barrier 118 is typically a dielectric material, such as $SiO_2$. In the example of FIG. 1, isolation barrier 118 is composed of two distinct dielectric layers—layer 114 and layer 116—although an isolation barrier may also be composed of a single dielectric layer or more than 2 dielectric layers. Each dielectric layer 114 and 116 is relatively thick, and the physical thickness of isolation barrier 118 results in the electrical isolation of components 120 and 122 from each other. In capacitive embodiments, the isolation-barrier rating of isolation barrier 118 is determined by the plate size of components 120 and 122, the distance between the those components, and the dielectric material used in dielectric layer 114 and dielectric layer 116. In particular embodiments, dielectric layers 114 and 116 may be the same dielectric material or may be made of different dielectric materials.

Isolator 100 is mounted on a substrate 102, for example which provides the mechanical support for, and electrical connections to, isolator 100. In the example of FIG. 1, thin dielectric layer 106 creates a dielectric-substrate boundary 104 between substrate 102 and the components of isolator 100. The example of FIG. 1 also includes a second thin dielectric layer 108. Each thin dielectric layer 106 and 108 may, for example, be made of $SiO_2$, although other dielectric materials may be used, and layers 106 and 108 may be made of different dielectric materials. While the example of FIG. 1 illustrates components 120 and 122 as being vertically oriented relative to substrate 102, such that component 122 is further from the substrate than is component 120, this disclose contemplates that other orientations of components 120 and 122 (and of isolation barrier 118 between them) may be used, such as a "horizontal" configuration in which components 120 and 122 are equidistant from the substrate.

In particular embodiments, thin layers 106 and 108 and 110 may be 0.1 to 0.5 μm thick, while thick dielectric layers 114 and 116 may be 5-10 μm thick. While other embodiments may use other thicknesses, thick dielectric layers are typically around 10-100 times (or more) thicker than thin dielectric layers in an isolator.

While substrate 102 is not a conductive material, substrate 102 nevertheless can electrically interact with either or both of electrical components 120 and 122. For example, the electrical coupling between substrate 102 and component 120 may be modeled as a parasitic capacitive coupling 124, and this coupling can introduce noise in isolator 100 and degrade the signal to be transmitted over isolation barrier 118. Parasitic coupling from substrate 102 may occur with either or both of components 120 and 122.

A relatively higher parasitic coupling results in relatively worse signal transfer performance over an isolation barrier and relatively higher noise characteristics in the transferred signal. This signal degradation can have a significant impact on the operation of isolator 100. For instance, if isolator 100 is integrated into a modulator/demodulator circuit, the parasitic coupling to the substrate can reduce the performance of the transmitted signal, and even degrade the signal to the point that the demodulator is unable to detect the information in the modulated signal.

The example isolator structure 100 of FIG. 1 introduces a thick dielectric layer 112 between thin dielectric layer 110 (i.e., the thin dielectric layer nearest isolation barrier 118) and isolation barrier 118. Thick dielectric layer 112 effectively increases the distance between substrate 102 and components 120 and 122, thereby decreasing the parasitic coupling between the substrate and those components, therefore improving signal quality and common mode transient immunity. For instance, as parasitic capacitance is inversely proportional to distance from the substrate, thick dielectric layer 112 greatly decreases the parasitic capacitance coupling between substrate 102 and components 120 and 122— for example, a reduction by 75%-90% or more. Thick dielectric layer 112 may have a thickness similar to, or the same as, a thick layer in the isolation barrier (e.g., layers 114 and 116 in the example isolator of FIG. 1); or may have a different thickness than such layers (e.g., may be thicker or may be somewhat thinner).

While the example of FIG. 1 illustrates a single thick dielectric layer in between substrate 102 and isolation barrier 118, this disclosure contemplates that additional thick dielectric layers and/or multiple thin dielectric layers may be used to increase the distance between substrate 102 and isolation barrier 118.

Figure 2:
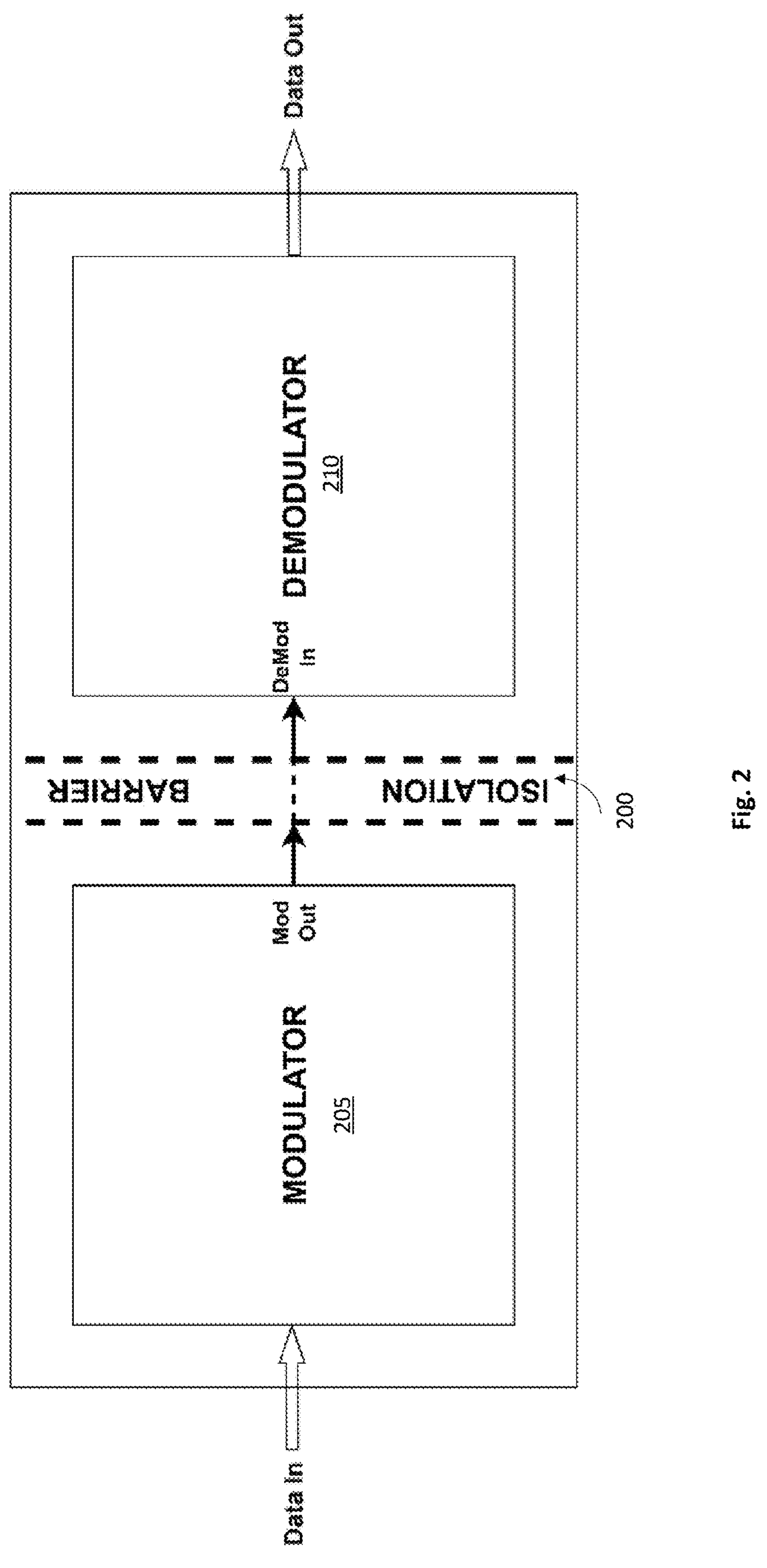
FIG. 2 illustrates an example in which an isolator is used to isolate a modulator from a demodulator.

By reducing parasitic capacitive coupling, isolator 100 improves signal quality between components 120 and 122. As a result, isolator 100 provides better performance than a conventional isolator for a given purpose, and isolator 100 enables the transfer of signals in low-level or noisy conditions that conventional isolators cannot successfully operate in. For example, FIG. 2 illustrates an example in which isolator 200 is used to isolate a modulator 205 from a demodulator 210. By incorporating the structure described herein (e.g., the structure of isolator 100 of FIG. 1), isolator 200 improves the fidelity of the signal communicated between modulator 205 and demodulator 210 across isolation barrier 200.

This disclosure contemplates that particular embodiments may place one or more thick dielectric layers 112 between any of what in FIG. 1 is shown as three thin dielectric layers 106, 108, and 110. In other words, one or more thick dielectric layers may be placed between thin layers 108 and 110 or between thin layers 106 and 108, etc. However, in practice, foundry limitations may effectively require thin dielectric layers to be deposited on top of each other, so that the introduction of thick dielectric layer 112 is mostly feasible after those layers have been deposited. Other foundry limitations include the thickness of various layers, particularly of thin layers 106, 108 and 110. The thickness of these thin layers are typically set by the foundry's process and are essentially fixed, and are not feasible to change during the manufacturing process; however, if such changes are feasible, then effectively introducing thick dielectric layer 112 to one or more of the thin dielectric layers (e.g., increasing the thickness of thin dielectric layer 110) would also be an example embodiment of this disclosure.

In the example of FIG. 1, thick dielectric layers and thin dielectric layers already exist in the manufacturing process for an isolator, and therefore thick dielectric layer 112 can be introduced between substrate 102 and isolation barrier 118 without requiring the creation of custom or non-standard layer thickness to the existing manufacturing process; rather, a new layer with an existing thickness specification is added to the isolator. For instance, thick dielectric layer 112 may be identical to thick dielectric layers 114 and 116 in terms of its manufacturing specifications (e.g., its thickness and dielectric material).

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend.

What is claimed is:

1. An electrical isolator comprising:

a first electrical component and a second electrical component configured to wirelessly communicate electrical signals with each other;

an isolation barrier comprising one or more dielectric layers that electrically isolate the first electrical component from the second electrical component; and one or more dielectric layers between a substrate on which the isolator is mounted and the isolation barrier, comprising:

one or more thin dielectric layers; and one or more thick dielectric layers that reduce a parasitic electrical coupling between the substrate and at least one of the first electrical component and the second electrical component.

2. The electrical isolator of claim 1, wherein the first electrical component comprises a first capacitor plate and the second electrical component comprises a second capacitor plate.

3. The electrical isolator of claim 1, wherein the first electrical component comprises a first inductive coil and the second electrical component comprises a second inductive coil.

4. The electrical isolator of claim 1, wherein each of the one or more thick dielectric layers are at least 10 times as thick as each of the one or more thin dielectric layers.

5. The electrical isolator of claim 1, wherein each thin dielectric layer has a thickness of about 0.1 to 0.5 micrometers.

6. The electrical isolator of claim 1, wherein each thick dielectric layer has a thickness of about 5 to 10 micrometers.

7. The electrical isolator of claim 1, wherein the one or more thick dielectric layers that reduce the parasitic electrical coupling separate the one or more thin dielectric layers from the isolation barrier.

8. The electrical isolator of claim 1, wherein each of the one or more thick dielectric layers between the substrate and the isolation barrier have substantially the same thickness as each of the one or more dielectric layers in the isolation barrier.

9. The electrical isolator of claim 1, wherein at least one first thick dielectric layer between the substrate and the isolation barrier has a thickness that is different than a thickness of at least one second thick dielectric layer in the isolation barrier.

10. The electrical isolator of claim 9, wherein the at least one first thick dielectric layer is thicker than the at least one second thick dielectric layer.

11. The electrical isolator of claim 9, wherein the at least one first thick dielectric layer is thinner than the at least one second thick dielectric layer.

12. The electrical isolator of claim 1, wherein:

the first electrical component is electrically coupled to an output of a modulator; and the second electrical component is electrically coupled to the input of a demodulator.

* * * * *